(12) United States Patent
Jinbo

(10) Patent No.: US 7,868,641 B2
(45) Date of Patent: Jan. 11, 2011

(54) SEMICONDUCTOR DEVICE

(75) Inventor: Toshikatsu Jinbo, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 19 days.

(21) Appl. No.: 12/200,940

(22) Filed: Aug. 29, 2008

(65) Prior Publication Data

US 2009/0058453 A1 Mar. 5, 2009

(30) Foreign Application Priority Data

Aug. 29, 2007 (JP) ............................. 2007-222095

(51) Int. Cl.
*G01R 31/02* (2006.01)
*G01R 31/28* (2006.01)

(52) U.S. Cl. ...................... 324/765; 324/763; 324/760; 324/158.1; 365/201; 365/230.06; 714/724; 714/733

(58) Field of Classification Search ......... 324/754–765; 365/201–230.06; 714/724–733
See application file for complete search history.

(56) References Cited

U.S. PATENT DOCUMENTS 5,638,331 A * 6/1997 Cha et al. .................. 365/201
5,982,189 A * 11/1999 Motika et al. ............... 324/763
6,731,551 B2 * 5/2004 Pekny ......................... 365/201
6,741,511 B2 * 5/2004 Nakao ......................... 365/201
6,996,753 B2 * 2/2006 Cho ............................ 714/718
7,174,489 B2 * 2/2007 Sadakata et al. ............. 714/719
2005/0018499 A1 * 1/2005 Marr .......................... 365/201
2008/0043553 A1 * 2/2008 Suzuki et al. ............... 365/201
2010/0142300 A1 * 6/2010 Chen et al. .................. 365/201

FOREIGN PATENT DOCUMENTS

JP  5-297076    11/1993
JP  2001-356147 12/2001

* cited by examiner

*Primary Examiner*—Ha Tran T Nguyen
*Assistant Examiner*—Emily Y Chan
(74) *Attorney, Agent, or Firm*—Young & Thompson

(57) ABSTRACT

A semiconductor device with technology for externally deciding if the stress test was performed or not. A semiconductor device includes a stress test circuit and a stress test decision circuit. The stress test circuit outputs control signals for executing the stress test to the stress test decision circuit and the object for testing. The stress test decision circuit then outputs the decision results if the stress test was performed, based on the control signals.

11 Claims, 6 Drawing Sheets

SEMICONDUCTOR DEVICE

FIELD OF THE INVENTION

This invention relates to a semiconductor device and relates in particular to testing of semiconductor devices.

BACKGROUND OF THE INVENTION

Various tests are made to sort out initial failures and boost quality in processes for manufacturing semiconductor devices (See for example, JP-A-Hei 5(1993)-297076.) In semiconductor devices including DRAM memory cells for example, these semiconductor test processes include checks of AC, DC characteristics, and reading/writing on the memory cell, etc.

FIG. 1 is a block diagram showing the structure of the semiconductor device disclosed in JP-A-Hei 5(1993)-297076. The semiconductor device in FIG. 1, tests a first internal circuit 102, a second internal circuit 103, and a third internal circuit 104 controlled by a test control circuit 106. In the technology disclosed in JP-A-Hei 5(1993)-297076, a test-result output circuit 108 outputs test results from the second internal circuit 103 to an output terminal 101 through switching control via a MOS 110 connected to the input terminal 101.

In the technology disclosed in JP-A-Hei 5(1993)-297076, the test control circuit 106 stores expectation values for internal circuit (first internal circuit 102-third internal circuit 104) operation in advance, compares these expectation values with the internal circuit (first internal circuit 102-third internal circuit 104) test results and judges the test results by outputting the matching/mismatching information.

Besides the technology disclosed in JP-A-Hei 5(1993)-297076, other methods are known for finding initial failures in semiconductor devices (See for example, JP-A-2001-356147). In order to directly check whether there is a burn-in mode set signal and power for the burn-in test, the technology in JP-A No. 2001-356147 contains a detecting unit to sense if there is a burn-in mode set signal and power (supply) for the burn-in test, and a detection result storage region for storing the results from the detecting unit. This technology then decides whether or not a load is being applied to the semiconductor device during burn-in.

Semiconductor devices are being made ever more highly integrated in recent years so a test different from the above test (Hereafter called a stress test) applies a voltage higher than the normal voltage across the word lines and bit lines in the DRAM memory cell to screen for initial failures in the DRAM memory cell. This stress test is an extremely essential process in the overall semiconductor manufacturing process.

SUMMARY OF THE INVENTION

The technology in JP-A-Hei 5 (1993)-297076 judges the test results by utilizing expectation values for internal circuit operation. This type of technology is effective for making functional checks, etc. However, making a correct judgment with this technology is impossible even if utilizing technology that performs stress tests on the memory cell.

The technology disclosed in JP-A-2001-356147 contains a burn-in detection method including a detecting unit in the semiconductor device to sense if there is a burn-in mode set signal and power (supply), and a detection result storage region for holding those check results from the detecting unit. The technology in JP-A No. 2001-356147 decides whether or not stress was applied in the burn-in test by way of the power in the circuit targeted for burn-in. However, in some cases deciding whether or not burn-in was actually performed inside the device is impossible even if monitoring a voltage applied externally to the circuit for burn-in, etc.

Moreover, the conventional art has the problem that making a decision is impossible in cases where the correct stress was not applied due to a defect in the test control circuit for the semiconductor device is defective, or cases where the correct stress test was not applied due to problems with the test equipment so that the semiconductor device might be shipped to the customer even though initial failures in the manufactured semiconductor were overlooked.

In order to resolve these problems, this invention has the object of providing technology to decide whether the stress test was actually performed.

The means to solve the problems of this invention are described next utilizing the numerals in the "Detailed Description of the Present Invention". These numerals are added to clarify the relation between the "Claims" and the "Detailed Description of the Preferred Embodiments". However, these numerals must not be used to interpret the technical range described in the claims.

To resolve the above problems, a semiconductor device 1 contains a stress test circuit 11 and a stress test decision circuit 12. The stress test circuit 11 in this way outputs the control signals (TM1-TM3) for performing the stress test to the test object 2 and the stress test decision circuit 12. The stress test decision circuit 12 then outputs decision results showing whether the stress test was performed based on the control signals (TM1-TM3).

This semiconductor device contains a register for retaining values showing the control signals (TM1-TM3) for controlling the operation in the stress test. These values are set in the respective registers when all stress tests are completed. The state set by the AND signal serving as the decision signal TMA is output. The decision signal TMA state is output to the output terminal DQ0.

Utilizing this invention therefore allows deciding externally whether the stress test was actually performed or not.

DETAILED DESCRIPTION OF THE PREFERRED EMBODIMENTS

First Embodiment

Figure 1:
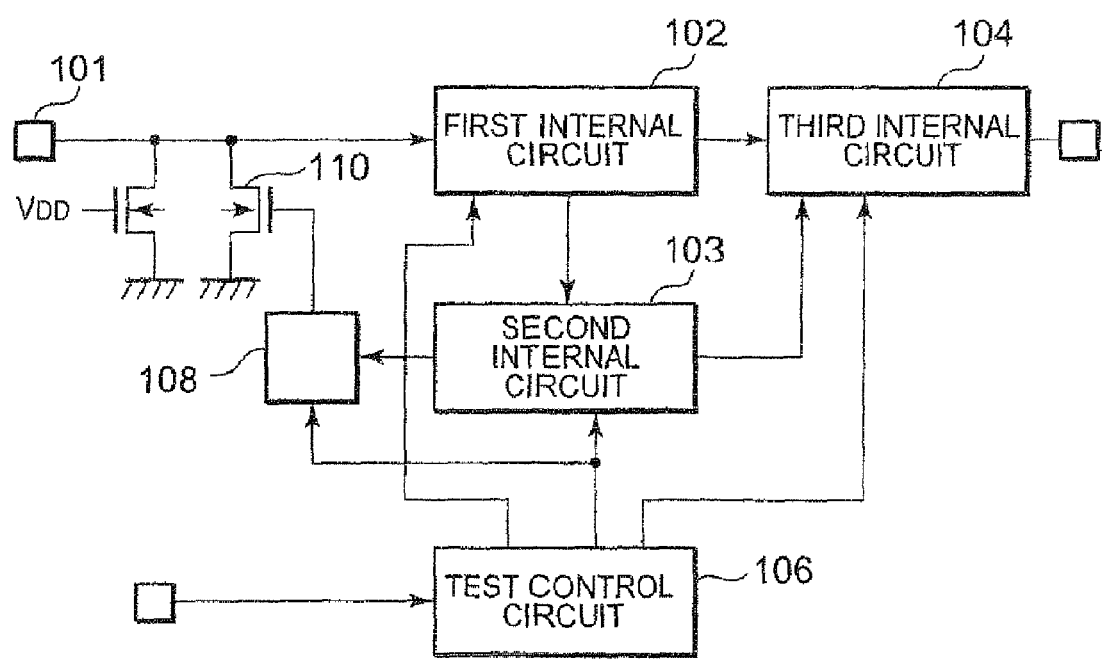
FIG. 1 is a block diagram showing the structure of the semiconductor device of the related art.
Figure 2:
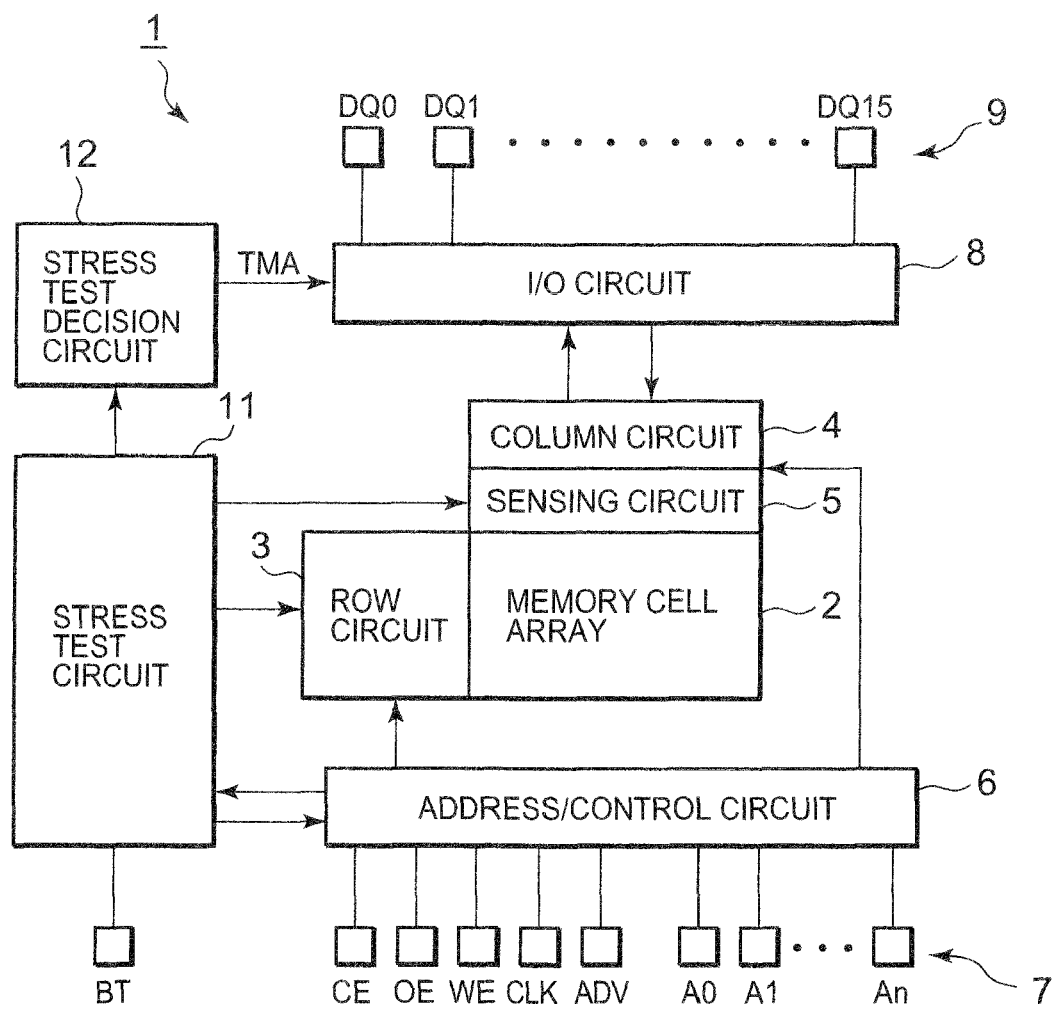
FIG. 2 is a block diagram showing an example of the structure of semiconductor device of the first embodiment.

The embodiments for implementing this invention are described hereafter while referring to the drawings. FIG. 2 is a block diagram showing an example of the structure of semiconductor device 1 of this embodiment. In the example in the following embodiment, the semiconductor device 1 is a DRAM module serving as the semiconductor memory device.

The semiconductor device 1 includes a memory cell array 2, a row circuit 3, a column circuit 4, a sensing circuit 5, and address/control circuit 6, an I/O circuit 8, a stress test circuit 11 and a stress decision circuit 12. The address/control circuit 6 is connected to the terminal group 7. The I/O circuit 8 connects to the data input/output terminal group 9.

The memory cell array 2 contains multiple DRAM cells (memory element) positioned in arrays. The row circuit 3 decodes the row address supplied by the address/control circuit 6 and selects a word line. The column circuit 4 decodes the column address supplied from the address/control circuit 6 and selects a bit line. The sensing circuit 5 amplifies the read out data. The I/O circuit 8 inputs and outputs data for the memory cell array 2.

The stress test circuit 11 makes entries in stress test mode by way of the dedicated pin BT for making stress test entries, controls the peripheral circuits and makes stress tests on the preset DRAM memory cell array. The stress decision circuit 12 includes a function to decide whether the stress test was made or not based on control signals for the stress test output from the stress test circuit 11.

Figure 3:
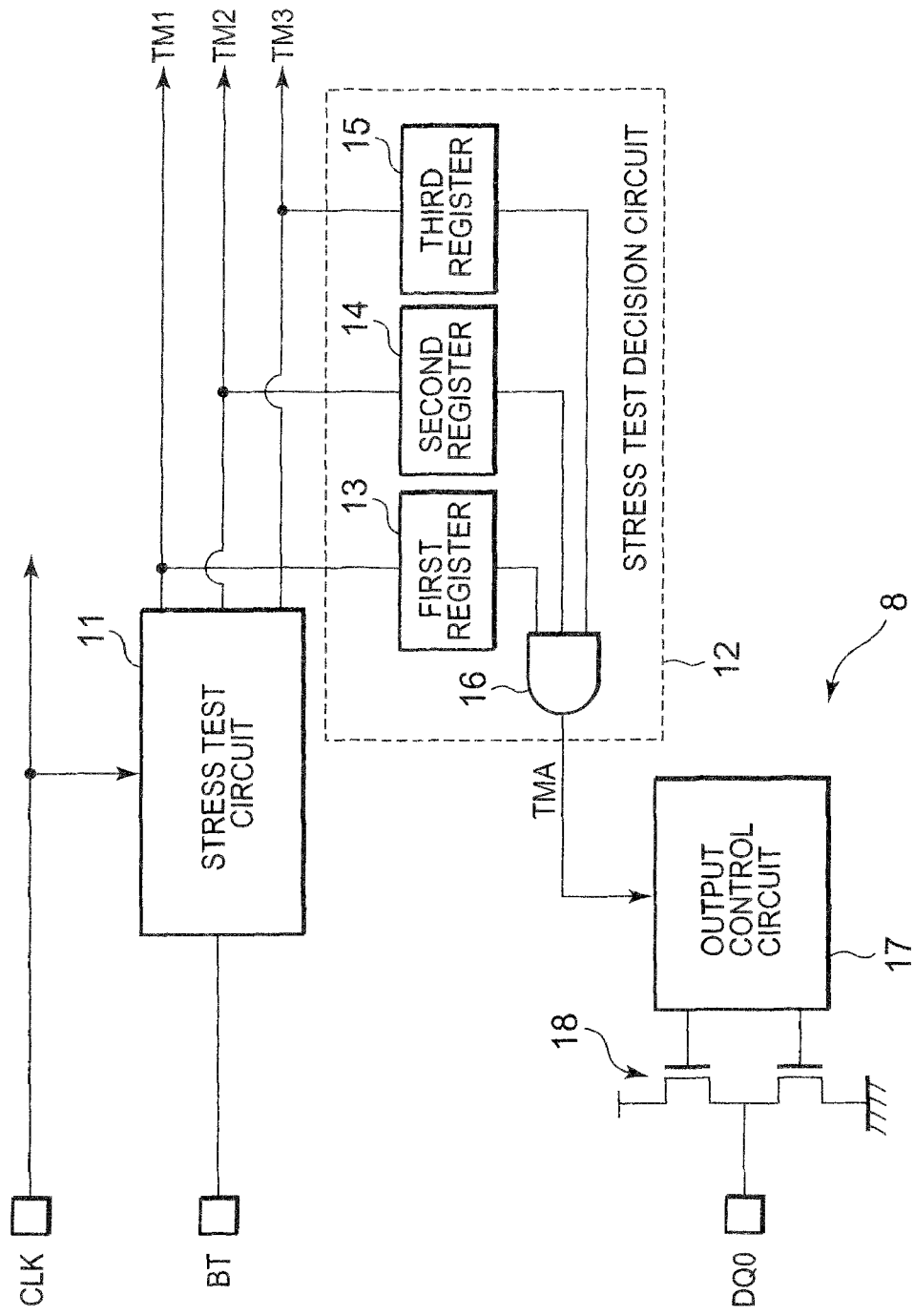
FIG. 3 is a block diagram showing an example of the structure of semiconductor device of the first embodiment.

FIG. 3 is a circuit diagram for showing in detail the structure of the stress test circuit 11 and the stress decision circuit 12. To make the present invention easier to understand, in the following embodiments, the description assumes that three types of stress conditions have been defined for the stress test. Referring to FIG. 3 shows that the stress decision circuit 11 outputs a first control signal TM1, a second control signal TM2, and a third control signal TM3 as control signals for executing the respective stress tests.

The stress decision circuit 12 contains a three registers (first register 13-third register 15) as well as an AND circuit 16. Each of these registers is connected to the stress test circuit 11. This stress test circuit 11 supplies the first control signal TM1 to the first register circuit 13. The stress test circuit 11 supplies the second control signal TM2 to the second register 14, and the third control signal TM3 to the third register 15.

When the control signal supplied to each register from the stress test circuit 11 shifts to High level, then that register is now in the set state.

The AND circuit 16 performs AND processing of the outputs from the three registers and outputs a decision signal TMA as the results. This decision signal TMA is supplied to the output control circuit 17 connected to the output terminal DQ0 by way of the control circuit 17. During the stress test, the output control circuit 17 sets the decision signal TMA to a state allowing output to the output terminal DQ0.

Figure 4:
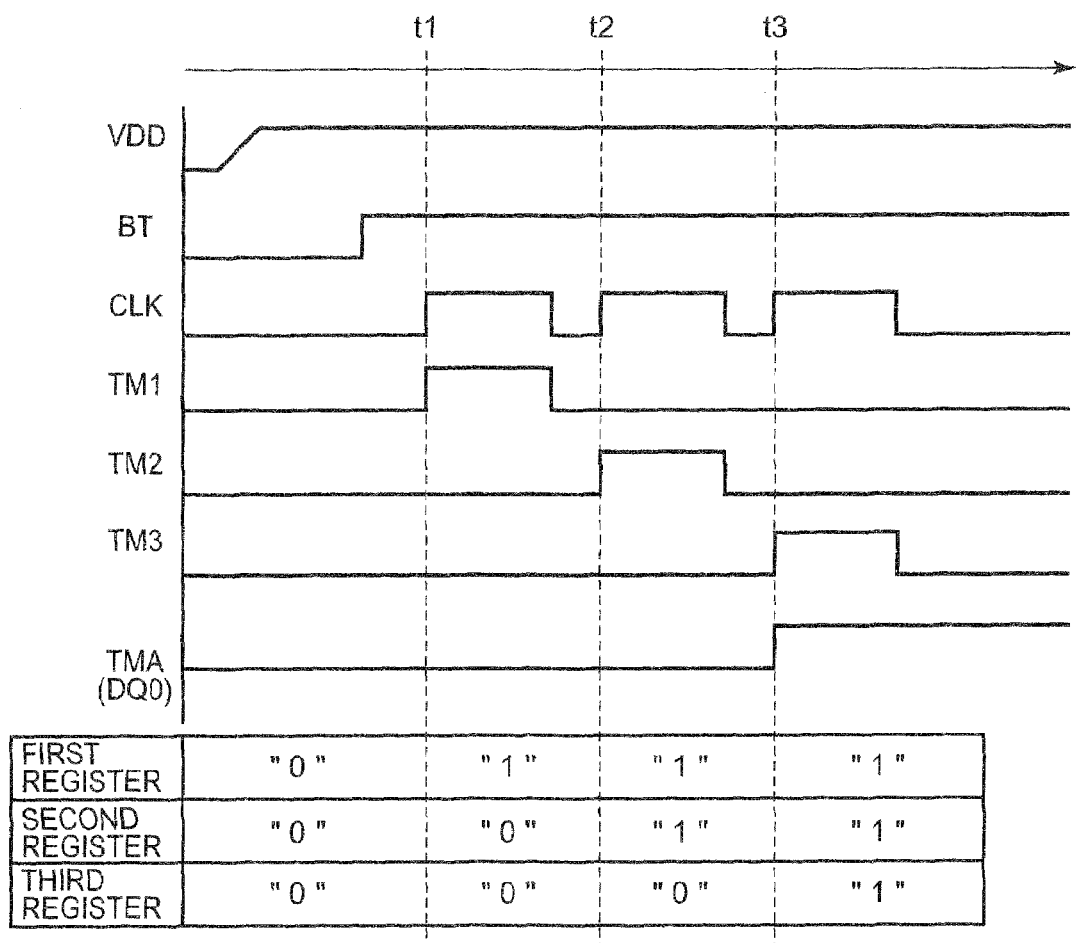
FIG. 4 is a timing chart for showing an example of the operation of the semiconductor device.

FIG. 4 is a timing chart showing an example of the operation of the semiconductor device 1 in this embodiment. This timing chart shows that after the power VDD is applied, the stress test entry pin BT transitions from Low level to High level, causing the semiconductor device 1 to shift to stress test mode. Clock pulses from the clock CLK then cause the stress test circuit to sequentially execute the pre-defined stress tests.

At the time t1, a first clock pulse changes the first control signal TM1 from a Low level to a High level to execute the first stress test. The first register 13 is set to a "1" at this time. At the time t2, a second clock pulse changes the second control signal TM2 from a Low level to a High level to execute the second stress test. The second register 14 is set to a "1" at this time.

At the time t3, a third clock pulse changes the third control signal TM3 from a Low level to a High level to execute the third stress test. At this time, the third register 15 is set to a "1". The first register 13, the second register 14, and the third register 15 are all set to a "1" to change the decision signal TMA from Low level to High level. The output control circuit 17 outputs a High level from the external terminal DQ0 in response to the output from the AND circuit 16.

The stress decision circuit 12 of semiconductor device 1 of this embodiment as described above contains registers to store the information that a stress test was executed by changing control signals that control the stress test. The stress decision circuit 12 checks the status of all registers matching all the stress tests, and outputs that information externally. This type of structure and operation therefore allows checking from outside before the stress test ends the semiconductor device 1 that the stress test was performed. Judging whether the stress test functioned correctly or not based on these check results in this way prevents semiconductor devices with initial failures from being mistakenly shipped to customers.

Second Embodiment

Figure 5:
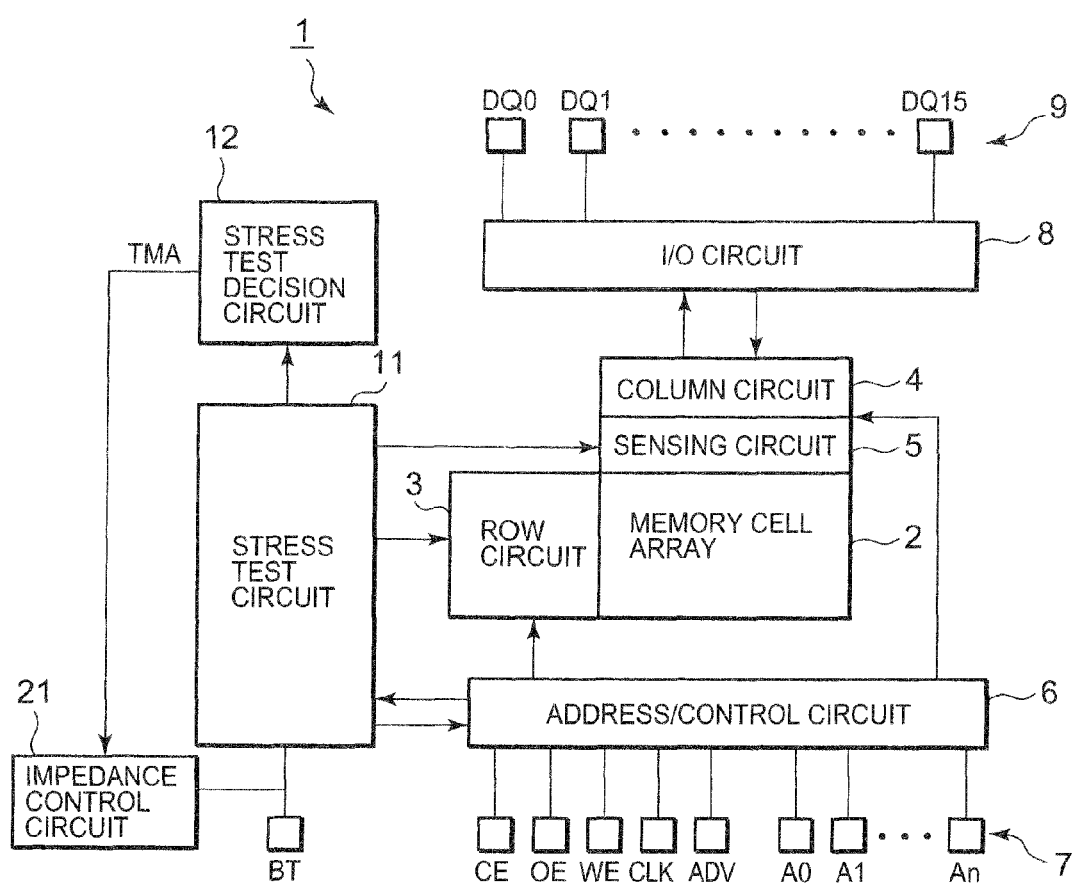
FIG. 5 is a block diagram showing an example of the structure of the semiconductor device of the second embodiment.

The second embodiment of this invention is described next. FIG. 5 is a block diagram showing an example of the structure of the semiconductor device 1. The semiconductor device 1 of the second embodiment includes the semiconductor device 1 of the first embodiment and moreover contains an impedance control circuit 21 for outputting decision signal TMA information externally.

Figure 6:
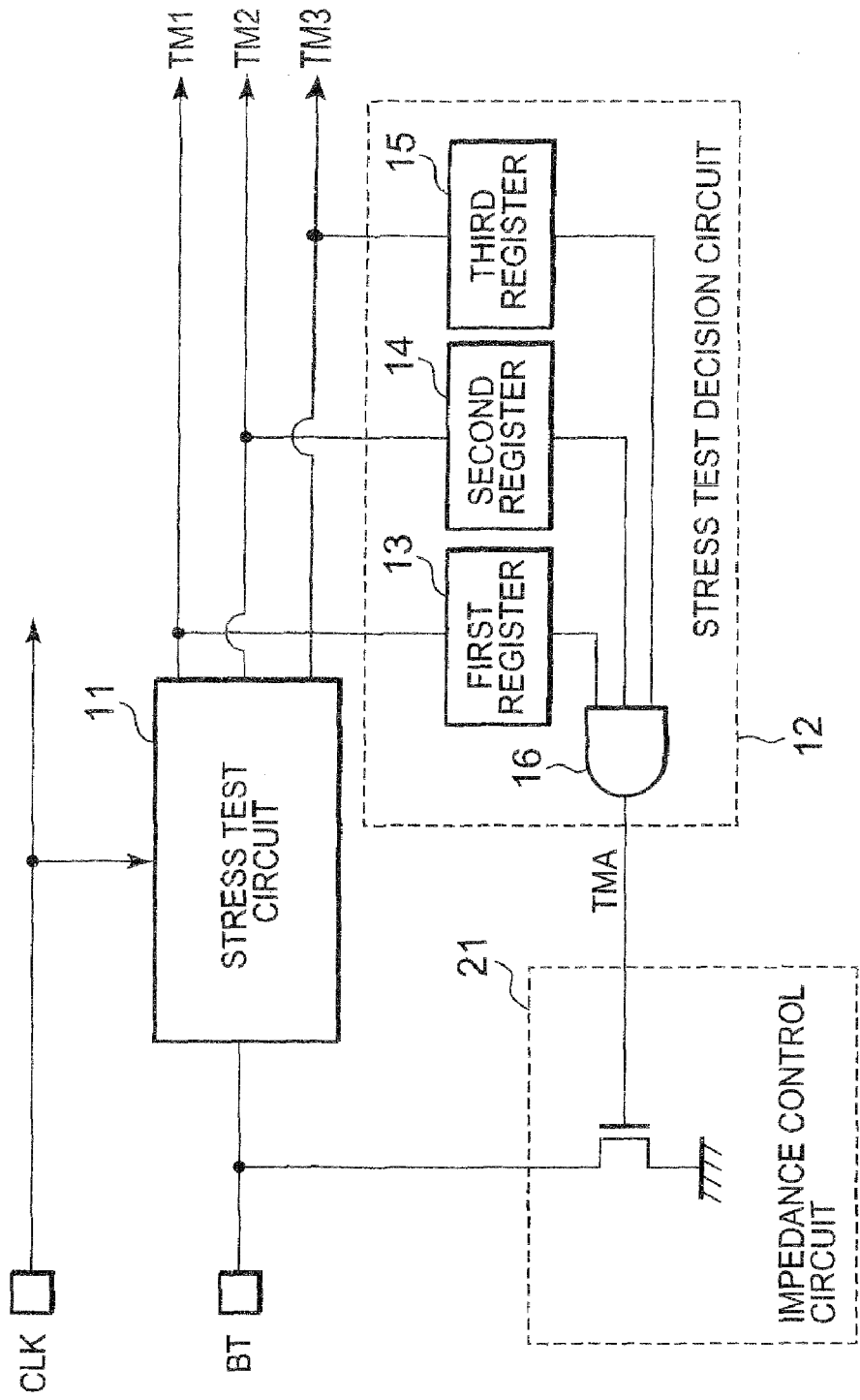
FIG. 6 is a block diagram showing an example of the structure of the semiconductor device of the second embodiment.

FIG. 6 is a circuit diagram showing in detail the structure of the impedance control circuit 21 of the second embodiment. The impedance control circuit 21 as shown in FIG. 6 contains an N-type Mosfet connected to the stress test entry pin BT. The gate of this N-type Mosfet connects to the output terminal of the AND circuit 16. A decision signal TMA is supplied to the gate of this N-type Mosfet.

The N-type Mosfet conducts current when all stress tests on the semiconductor device 1 of the second embodiment are completed and the decision signal TMA changes to High level. The entry current to the stress test entry pin BT fluctuates at this time so whether the stress test was performed or not can be judged externally by monitoring changes in this entry current.

The semiconductor device stress test of the related art tests only the voltage applied for example to the word lines and bit lines of the DRAM memory cell. The semiconductor device stress test of the related art only makes decisions such as for functional checks, so judging whether the stress test was actually performed was impossible.

The semiconductor device 1 of the above embodiment contains registers for storing changes in the control signals that control the stress test. The semiconductor device 1 also contains a unit that conveys this register information to outside the device. By structuring the semiconductor device 1 as described above, a decision can be made if the stress test was incomplete before the stress test ends. Semiconductor devices with initial failures can in this way be prevented from being shipped to the customer and the quality can be improved. The multiple embodiments described above can be combined as needed within a range not causing a conflict between the structure and the operation.

What is claimed is:

1. A semiconductor device, comprising:
   a stress test circuit; and
   a stress test decision circuit,
   wherein the stress test circuit outputs control signals for executing the stress test to the stress test decision circuit and the object for testing, wherein before the stress test ends, the stress test decision circuit outputs decision results showing whether or not the stress test was executed based on the control signals, wherein the control signal includes test execution commands for executing different plural stress tests, and wherein the stress test decision circuit includes plural registers for holding data corresponding to each of the plural stress test execution commands, and a logic circuit for outputting the decision results after deciding that all the different plural stress tests were executed based on the output from the plural registers.

2. The semiconductor device according to claim 1, wherein the stress test circuit executes the stress test in response to signals supplied by way of a stress test entry dedicated pin BT.

3. The semiconductor device according to claim 1, further comprising:

an output unit that generates signal voltages showing the decision results, wherein the output unit supplies the signal voltages to a stress test entry dedicated pin BT.

4. The semiconductor device according to claim 1, wherein the stress test circuit controls peripheral circuits of a memory module.

5. The semiconductor device according to claim 4, wherein the peripheral circuits include row and column circuits of a memory cell array.

6. The semiconductor device according to claim 1, wherein the object for testing includes a memory array.

7. An operation method for a semiconductor device including a stress test circuit and a stress test decision circuit, comprising:

(a) a step for the stress test circuit to output control signals for executing the stress test, to the stress test decision circuit and the object for testing, and (b) a step for the stress test decision circuit to output the decision results showing whether the stress test was executed or not based on the control signals, wherein the control signals include plural stress test execution commands for executing different plural stress tests, and wherein the (b) step includes:

a step for plural registers to hold data corresponding to each of the plural stress execution commands, and a step for outputting the decision results when decided that all the plural stress tests were executed based on the output from the plural registers.

8. The operation method for a semiconductor device according to claim 7, wherein the (a) step includes:

a step for executing the stress test in response to signals supplied by way of a stress test entry dedicated pin BT, and wherein the (b) step includes:

a step for supplying signal voltages indicating the decision results to the stress test entry dedicated pin BT.

9. The operation method for a semiconductor device according to claim 7, further comprising controlling peripheral circuits of a memory module using the stress test circuit.

10. The semiconductor device according to claim 9, wherein the peripheral circuits include row and column circuits of a memory cell array.

11. The semiconductor device according to claim 7, wherein the object for testing includes a memory array.

* * * * *